(12) United States Patent
Vardeny et al.

(10) Patent No.: US 7,682,707 B2
(45) Date of Patent: Mar. 23, 2010

(54) ORGANIC LIGHT-EMITTING DEVICES USING SPIN-DEPENDENT PROCESSES

(75) Inventors: Z. Valy Vardeny, Salt Lake City, UT (US); Markus Wohlgenannt, Salt Lake City, UT (US)

(73) Assignee: University of Utah, Salt Lake City, UT (US)

( * ) Notice: Subject to any disclaimer, the term of this patent is extended or adjusted under 35 U.S.C. 154(b) by 455 days.

(21) Appl. No.: 11/110,445

(22) Filed: Apr. 20, 2005

(65) Prior Publication Data

US 2005/0191521 A1 Sep. 1, 2005

Related U.S. Application Data

(62) Division of application No. 10/047,688, filed on Jan. 15, 2002, now abandoned.

(60) Provisional application No. 60/261,368, filed on Jan. 16, 2001.

(51) Int. Cl.
*H01L 51/54* (2006.01)
*C09K 11/06* (2006.01)

(52) U.S. Cl. ........................ 428/690; 428/917; 313/503; 313/504; 257/40; 257/E51.027; 257/E51.031; 257/E51.032; 524/176; 524/398; 524/413; 524/435; 524/440; 438/3; 438/99

(58) Field of Classification Search ....................... None
See application file for complete search history.

(56) References Cited

U.S. PATENT DOCUMENTS

| 5,152,955 | A | * | 10/1992 | Russell | 376/107 |
| 6,312,835 | B1 | * | 11/2001 | Wang et al. | 428/690 |
| 6,621,100 | B2 | * | 9/2003 | Epstein et al. | 257/40 |
| 2002/0028347 | A1 | * | 3/2002 | Marrocco, III et al. | 428/690 |
| 2002/0076576 | A1 | * | 6/2002 | Li et al. | 428/690 |

* cited by examiner

*Primary Examiner*—Marie R. Yamnitzky
(74) *Attorney, Agent, or Firm*—Gifford, Krass, Sprinkle, Anderson & Citkowski, P.C.

(57) ABSTRACT

The maximum luminous efficiency of organic light-emitting materials is increased through spin-dependent processing. The technique is applicable to all electro-luminescent processes in which light is produced by singlet exciton decay, and all devices which use such effects, including LEDs, superradiant devices, amplified stimulated emission devices, lasers, other optical microcavity devices, electrically pumped optical amplifiers, and phosphorescence (Ph) based light emitting devices. In preferred embodiments, the emissive material is doped with an impurity, or otherwise modified, to increase the spin-lattice relaxation rate (i.e., decrease the spin-lattice time), and hence raise the efficiency of the device. The material may be a polymer, oligomer, small molecule, single crystal, molecular crystal, or fullerene. The impurity is preferably a magnetic or paramagnetic substance. The invention is applicable to IR, UV, and other electromagnetic radiation generation and is thus not limited to the visible region of the spectrum. The methods of the invention may also be combined with other techniques used to improve device performance.

13 Claims, 4 Drawing Sheets

ORGANIC LIGHT-EMITTING DEVICES USING SPIN-DEPENDENT PROCESSES

REFERENCE TO RELATED APPLICATION

This application is a divisional of U.S. patent application Ser. No. 10/047,688, filed Jan. 15, 2002, which claims priority from U.S. provisional patent application Ser. No. 60/261,368, filed Jan. 16, 2001, the entire content of both of which are incorporated herein by reference.

This invention was made with Government support under Contract No. DEFG0393ER45490 awarded by the Department of Energy. The Government has certain rights to this invention.

FIELD OF THE INVENTION

This invention relates generally to organic light-emitting devices and, in particular, to improvements in the light emissivity of such materials using spin-dependent processes.

BACKGROUND OF THE INVENTION

Organic light-emitting materials have great commercial potential in a number of areas, including light-emitting devices and displays. Organic materials offer potential advantages in low-cost fabrication, large-area and mechanically flexible devices, and the availability of diverse molecular-structure property relationships.

A conventional polymer electro-luminescent device comprises a thin film of electro-luminescent polymer sandwiched between two electrodes. Polymer electro-luminescent devices are described, for example, in U.S. Pat. Nos. 5,247,190 and 5,399,502 to Friend et al., in U.S. Pat. No. 4,356,429 to Tang, U.S. Pat. No. 4,672,265 to Eguchi et al., U.S. Pat. No. 4,539,507 to VanSlyke and Tang. The entire contents of these patents are incorporated herein by reference.

Efficiency is an important parameter in device design, and is related to the ratio of light energy out to electrical energy in. The quantum efficiency of a device is related to the number of photons emitted relative to the number of charge carriers introduced to the emissive material. Quantum efficiency is in turn dependent on a number of factors, which are discussed in more detail below.

If device efficiency can be increased, brighter displays are possible for the same electrical input. Alternatively, electrical input can be reduced for the same light output, which saves energy and may increase the lifetime of the display, another important design parameter.

Conjugated polymers are often used in organic electro-luminescent devices. These polymers typically comprise a backbone having alternating single and double carbon-carbon bonds, such that extensive electron delocalization occurs. When polymers of this type are used as conducting polymers, an oxidizing agent may be added to remove an electron from a polymer double bond. The remaining lone electron, associated with a positive charge due to the removal of an electron, can then propagate along the polymer chain under the influence of an electric field. This propagating charge is known as a polaron. Reducing agents may be used to donate additional electrons to the chain, which may also propagate along the chains as polarons.

In electroactive devices using conjugated polymers, a polymer film is typically in contact with two electrodes. Electrons are injected into the polymer at one electrode, and electrons are withdrawn from the polymer at the other electrode. The withdrawal of electrons is usually termed hole injection, as the absence of the electron, or hole, propagates in the manner of a positively charged charge carrier. The injected electrons propagate as negative polarons, the injected holes propagate as positive polarons. Electro-luminescence may occur due to the interaction of positive and negative polarons, as discussed below. This interaction may sometimes be termed recombination or annihilation of carriers.

Within the organic layer, charge-transfer (CT) reactions occur between a positively charged polaron ($P^+$) and a negatively charged polaron ($P^-$). The polarons are associated with two participating locations (such as polymer chain segments), and each polaron has spin ½. The interaction between the two oppositely charged polarons leads to the formation of an intermediate encounter complex, involving both locations, and then to the formation of a final state. The final state comprises the ground state of one participant and an excited state of the other participant. The excited state may be either a neutral exciton singlet state (S) or a neutral exciton triplet state (T). Light emission occurs only for singlet exciton decay. The triplet decay channels are non-emissive, an the decay times are typically much longer than the singlet channel decay time. For a light-emissive device, the triplet decay channel is undesirable.

Denoting the formation cross section of the singlet exciton channel as $\sigma_S$ and the formation cross section of any one of the three equivalent triplet exciton channels as $\sigma_T$, it is conventionally assumed that the two cross-sections are approximately equal, i.e. the singlet-triplet cross section ratio ($\sigma_S/\sigma_T$) ~1. This is true for systems with no significant electron correlation effects. If the two cross-sections are equal, and if there is no energy barrier for the annihilation process of holes and electrons, this results in only 25% of the excited states decaying through the singlet channel, as there will be only one singlet state formed for every three triplet states formed.

The quantum efficiency of an electro-luminescent device is given by $$\eta = \eta_1 \eta_2 \eta_3$$

where $\eta_1$ is the singlet emission quantum efficiency, $\eta_2$ is the fraction of the total number of excitons that are singlets, and $\eta_3$ is the probability that the injected electrons and holes find each other to form electron-hole pairs. If $\eta_2$ is limited to 0.25, due to only one singlet state being formed for every 3 triplet states formed, then the maximum electro-luminescence efficiency of the device is also restricted to 0.25. Clearly, it would be of great benefit if this restriction could be eased or eliminated.

SUMMARY OF THE INVENTION

Broadly according to the invention, the maximum luminous efficiency of organic light-emitting materials is increased through spin-dependent processing. The technique is applicable to all electro-luminescent processes in which light is produced by singlet exciton decay, and all devices which use such effects. Such devices, generally termed singlet-emissive devices, include LEDs, super-radiant devices, amplified stimulated emission devices, lasers, other optical microcavity devices, electrically pumped optical amplifiers, and phosphorescence (Ph) based light emitting devices.

In preferred embodiments, the emissive material is doped with an impurity, or otherwise modified, to increase the spin-lattice relaxation rate (i.e., decrease the spin-lattice time), and hence raise the efficiency of the device. The material may be a polymer, oligomer, small molecule, single crystal, molecular crystal, or fillerene. The impurity is preferably a magnetic or paramagnetic substance. The invention is applicable to IR, UV, and other electromagnetic radiation generation and is thus not limited to the visible region of the spectrum. The methods of the invention may also be combined with other techniques used to improve device performance.

DETAILED DESCRIPTION OF THE INVENTION

Before beginning, note that in this specification, the term "LED" refers to light-emitting devices, which include light-emitting diodes. Since the electrical pumping of LEDs results in electro-luminescence, such devices are also known as electro-luminescent devices. "OLED" refers to organic light-emitting devices, including LEDs based upon organic materials, such as polymers, molecular crystals, complexes (including metal-ligand complexes), and the like.

Recent experimental and theoretical work carried out by the inventors shows that $\sigma_S$ is greater than $\sigma_T$ for a number of conjugated polymers and oligomers. The results indicate that the singlet-triplet cross section ratio $(\sigma_S/\sigma_T)$ is greater than 1 for a number of polymers and oligomers, and that $(\sigma_S/\sigma_T)$ was related to the optical gap of the polymer or oligomer through a non-monotonic function.

Figure 1:
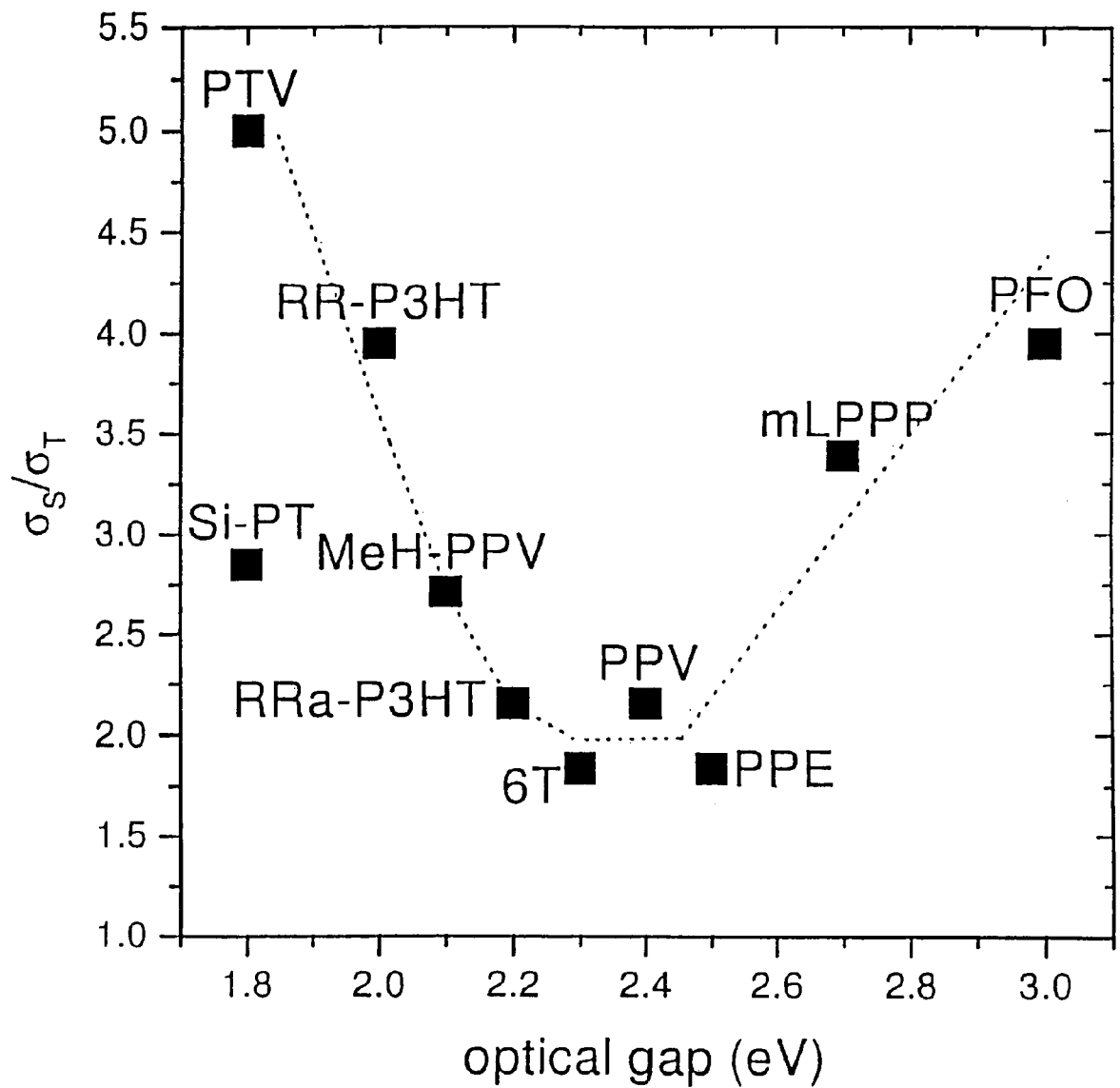
FIG. 1 is a chart which shows the singlet-triplet cross section ratio for a number of polymers.

FIG. 1 shows results for a number of materials as a function of optical gap. These data arose from a study of π-conjugated polymers using spin-dependent photo-absorption methods (combining photo-induced absorption with photo-absorption detected magnetic resonance). The abbreviations and acronyms are familiar to those skilled in the art of organic light-emitting diodes. RR stands for regio-random, a polymer configuration. The data of FIG. 1 show that these materials show preference for electron-hole recombination into an emissive singlet state, rather than into a non-emissive triplet state, due to a higher recombination cross section into the singlet state.

These unexpected results suggest that the maximum luminous efficiency of polymer light-emitting materials can be increased to a higher level than is conventionally expected. The present invention describes methods by which these improvements can be realized. The electro-luminescence quantum yield can be increased for materials in which only the singlet excitons are emissive. These materials include compounds such as polymers, molecular crystals/single crystals, small molecules, and fullerenes.

The condition $\sigma_S > \sigma_T$ does not by itself increase $\eta_2$, the fraction of the total number of excitons that are singlets, which is 0.25 in the case of as $\sigma_S = \sigma_T$. However, the presence of spin-flip processes can increase $\eta_2$. Spin-lattice and spin-spin relaxations are spin-flip processes which, when faster than the recombination rates to the singlet and triplet excitons, lead to the relationship $\eta_2 = \sigma_S/(\sigma_S + 3\sigma_T)$, i.e. $\eta_2 = 0.25$ if $\sigma_S = \sigma_T$, whereas $\eta_2 = 0.4$ if $\sigma_S = 2\sigma_T$. This relationship is discussed in Z. Shuai et al., Phys. Rev. Lett., vol. 84, pp. 131-134 (2000), which is incorporated herein by reference in its entirety.

An important aspect of this invention provides spin relaxation channels for the injected carriers from both electrodes, so that electrons and holes (both with spin ½) will not have a fixed spin state. Preferably, the carrier spins fluctuate sufficiently fast that their recombination from distant pairs into excitons will be determined by the recombination rate rather than by the quantum mechanical statistics. If the spin state is fixed for each injected carrier (which may happen only at liquid helium temperatures), than the e-h (electron-hole) pairs will form singlet or triplet excitons according to the statistical limit, meaning one singlet per three triplets. However, by providing a mechanism for rapid spin-flip of the carriers, then the quantum mechanical limit may be overcome. However, once the exciton is formed its spin state tends to be fixed regardless of the spin-carrying impurities, because of the relaxation energy that is dissipated in the recombination process from e-h pairs into the various exciton types.

Figure 2:
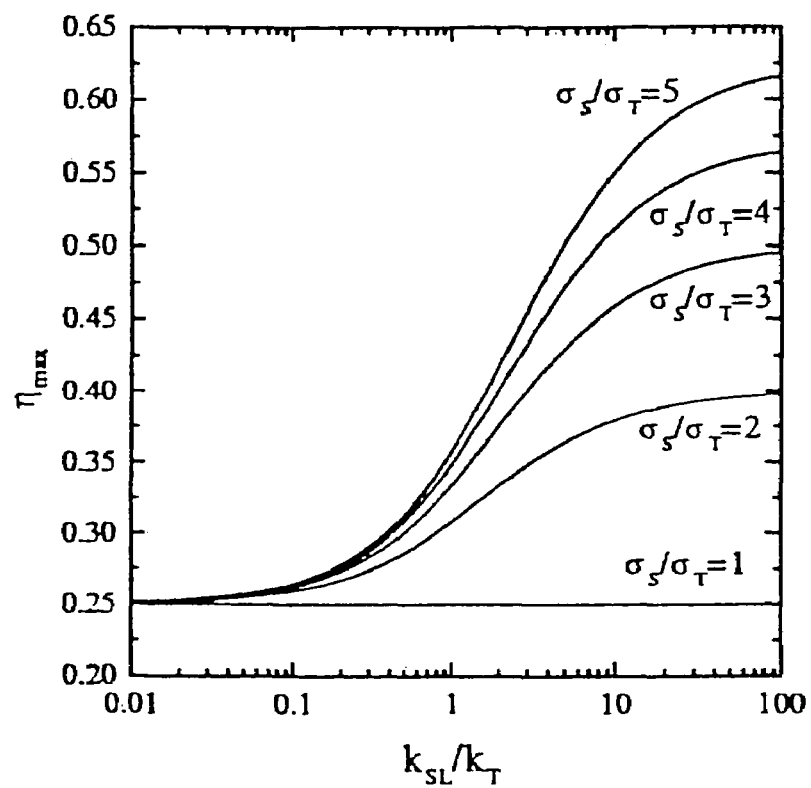
FIG. 2 is a chart which shows the maximum LED quantum efficiency as a function of the ratio of the recombination cross-section into the singlet and triplet excitons.

FIG. 2 shows the maximum LED quantum efficiency as a function of the ratio of the recombination cross-section into the singlet and triplet excitons $(\sigma_S/\sigma_T)$. The $k_{SL}/k_T$ is the ratio of spin lattice relaxation rate $k_{SL}$ to the formation rate of triplet excitons $k_T$. Suppose that the recombination into the singlet exciton is much faster than into the triplet exciton. Recent measurements by the inventors have shown this is true for a number of polymers and oligomers, as illustrated by FIG. 1.

If the spins of the injected electrons and holes are fixed in time, then even if the recombination into the singlet exciton from an electron-hole pair is faster, this will not help to overcome the quantum statistical limit of 25 percent efficiency. However, by providing a competing effect, such as spin-lattice relaxation, so that the e-h pairs undergo rapid spin flip, the triplet state may not be reached, because the recombination into the triplet exciton is slow. Under these conditions, the ratio of singlet/triplet creation will be determined mainly by the singlet/triplet recombination rates rather than by the quantum mechanics limit of 25 percent. Hence, the emission efficiency of a device can be increased by reducing the spin-lattice relaxation time.

The efficiency of an OLED can be improved by increasing the spin flip rate (or reducing the spin relaxation time) of carriers in the light emitting layer by the addition of spin-carrying impurities, such as ions (such as $Fe^{3+}$ and $Ti_{3+}$), molecules, radicals, molecular substituents, complexes, iron, or other magnetically active impurities. Preferably, the spin relaxation rate is faster than the pair recombination rate into triplet excitons. The concentration of such impurities is preferably not high enough to significantly enhance the non-radiative recombination of singlet excitons. Molecular and polymer based molecular magnetic materials are also known in the art, and may be added to emissive layers in embodiments of the present invention. Such materials are discussed, for example, in J. S. Miller and A. J. Epstein, *Designer Magnets*, Chemical & Engineering News 73 (40), 30-41 (1995), J. S. Miller and A. J. Epstein, *Molecular and Polymeric Magnets*, Chemistry and Industry, 49-53 (1996), J. S. Miller, A. J. Epstein, and W. M. Reiff, *Molecular/Organic Ferromagnets*, Science 240, 40-47 (1988), and J. M. Manriquez, G. T. Yee, R. S. McLean, A. J. Epstein, and J. S. Miller, *A Room Temperature Molecular/Organic-Based Magnet*, Science 252, 1415-1417 (1991), which are all incorporated herein by reference.

In preferred embodiments of the present invention, the emissive layer is doped with an impurity (or otherwise modified) so as to increase the spin-lattice relaxation rate (decrease the spin-lattice time), and hence increase the efficiency. The impurity is preferably a paramagnetic substance. Paramagnetic substances include transition metals (such as iron, manganese, and cobalt), lanthanides, actinides, and other certain alloys and compounds. The impurity may be selected from known paramagnetic shift reagents used in nuclear magnetic resonance spectroscopy.

Impurities (such as iron, cobalt, manganese, other transition metals, transition metal alloys, and transition metal compounds) can be added to the emissive layer in the form of microparnicles, microrods, nanoparticles, metal complexes, doped glasses, ceramics, other compounds, clusters, or other structures. For example, an OLED may comprise a layer of an electro-luminescent compound, such as the light emissive complex aluminum tris(quinolinolato), doped with an iron complex. Particles may be coated with an electrically insulating layer to help prevent short circuits. Iron complexes, or other molecules containing atoms having unpaired electrons, may be developed which are electro-luminescent, for use in light emitting devices. Light-emissive molecular crystal films may be grown containing paramagnetic crystal defects, including point defects such as F and V$^-$, so as to increase efficiency. Electrons or holes may be trapped at locations within an emissive film to provide addition relaxation channels. Other molecules become paramagnetic within the excited state, as will be discussed in more detail later.

A polymer material may be appropriately doped, or the structure of the polymer modified to achieve these effects. A composite material, mixture, or polymer blend, comprising an electro-luminescent component and a spin-relaxation inducing component, may be used. Polymers may also comprise paramagnetic substituents. For example, a polymer main-chain or side-chain may be modified so as to contain a paramagnetic atom or group. For example, a polymer may be partially substituted with a ferrocene-containing side-chain.

The present invention applies to other organic materials, including fullerenes, low molecular weight organic materials, complexes, molecular crystals, and the like, when used as emissive layers in an electro-luminescent devices. The singlet-triplet cross-section ratio has not been measured in molecular crystals, to the inventors' knowledge. However, it is expected that the triplet states are energetically below the singlet states, and so the singlet-triplet cross section ratio for molecular crystals is probably quite large. Hence, the present invention relates to light-emitting devices formed from organic crystals. The present invention relates to improving the light emission properties of any material having a singlet-triplet cross-section ratio greater than unity, where light emission results from the singlet recombination.

The efficiency improvement techniques described here related to all electro-luminescent processes in which light is produced by singlet exciton decay, and all devices which use such effects. These devices may be generally termed singlet emissive devices. These include LEDs, super radiant devices, amplified stimulated emission devices, lasers, other optical microcavity devices, electrically pumped optical amplifiers, and phosphorescence (Ph) based light emitting devices. As regards to phosphorescence devices, the LED efficiency may be improved if it is based on energy transfer between host and guest molecules that takes place in the singlet manifold. In addition the Ph efficiency can also improve for some organic media if the reverse relation holds for the singlet and triplet recombination rates, namely if $\sigma_S < \sigma_T$.

A general method for improving the luminescence efficiency of a singlet emissive film may comprise: determining the singlet/triplet ratio of the film; estimating the maximum efficiency available; adding an initial concentration of a dopant to the film; comparing the resulting measured efficiency with the estimated maximum efficiency; and based on the comparison, increasing or decreasing the dopant concentration. If actual efficiency does not attain close to the estimated maximum efficiency with a certain dopant, other dopants may then tried. The ratio $\sigma_S/\sigma_T$ can be determined for a given organic electro-luminescent material using either experimental measurements, or from the value of the band gap as illustrated in FIG. 1. This allows the maximum electroluminescent efficiency to be estimated. Impurities (or dopants) to increase spin-lattice relaxation rates can be added to the electro-luminescent material or precursor during device fabrication, for example during spin-coating, evaporation, epitaxy, vapor deposition, Langmuir-Blodgett film deposition, or other manufacturing step, so as to increase the efficiency of a device; The polymer precursors used in some manufacturing processes may be chemically modified to include spin-containing groups.

Even if spin fixing electrodes are put on LEDs to increase their quantum efficiency, reversing the spins due to paramagnetic impurities may still increase efficiency in some cases where the ratio of recombination into singlet and triplet is sufficiently large.

The Zeeman splitting of the spin ½ electrons and holes is very small in the absence of an external magnetic field. The spin-flip rate can be increased by providing more low-frequency vibrations, for example by modifying the lattice so that the lattice vibrations contain more low frequency components, or by adding impurities having low frequency vibrations. For example, the lattice structure (or molecular structures, including polymer structures) can be modified to include heavy atoms and/or weak bonding structures, so as to increase the low-frequency vibration components. An external magnetic field can also be applied so as to increase the spin-flip rate (decrease spin-lattice relaxation time). Other magnetic impurities can be used, such as ferromagnetic impurities. Magnetic particles can be dispersed throughout an emissive layer as nanoparticles, or a magnetic film can be provided in a device. Electromagnetic fields can be generated by current-carrying coils, loops, or rod antennae in proximity to a device. The spin flip rate can also be increased by increasing the temperature (or effective spin temperature), using techniques known in the art.

The present invention is also applicable to optically pumped devices. For example, in some optically pumped systems, the singlet state first dissociates into negative and positive charged carriers, which later recombine into other excitons. The techniques for increasing spin-flip rate described here, including the addition of magnetic impurities, can increase efficiency in such systems. Other pumping methods for which analogous arguments may be applied include the use of x-rays, UV, other electromagnetic radiation, and nuclear radiation.

Figure 3:
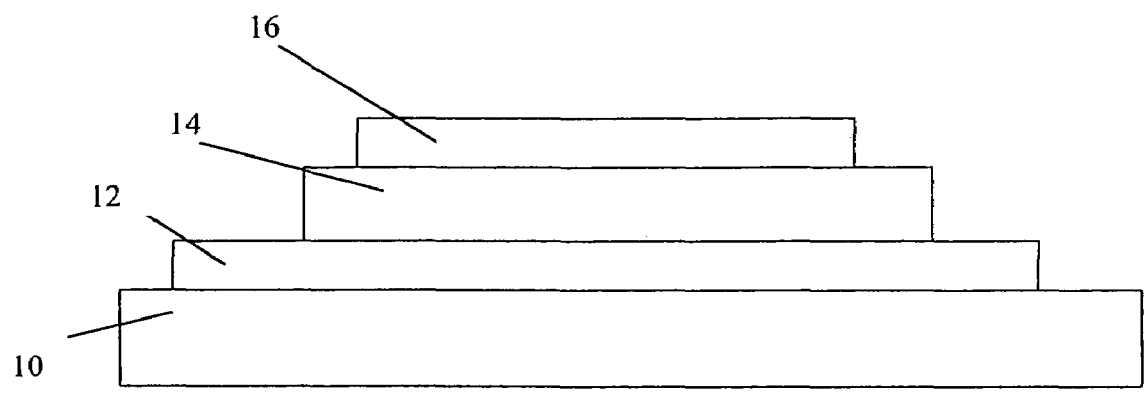
FIG. 3 is a simplified cross-section of an LED structure.

FIG. 3 is a schematic of an electro-luminescent device comprising a substrate 10 supporting a first electrode 12, a light emissive layer 14, and a second electrode 16. In a preferred embodiment, the emissive layer 14 is formed using a fluorene-containing polymer (a polyfluorene or PFO), the substrate 10 is a glass substrate, the first electrode (anode) 12 is transparent indium tin oxide (ITO), and the second electrode (cathode) 16 is a metal film such as calcium, magnesium, aluminum, or other metal or alloy with a suitable value of work function for electro-luminescent device operation. The emissive layer 14 is preferably doped with a magnetic impurity such as an iron-containing compound. Devices can be made by spin casting (spin coating) the PFO film a solution on to the ITO coated substrate. A small quantity of paramagnetic impurities are added to the solution before or during the spin casting, such as ferrites, or compounds containing atoms having a partially filled d-band, or organic molecules that carry unpaired spins. A solution of PFO polymer and one or more species of paramagnetic dopants can be spin-cast cast as the active layer of an LED or laser device. Laser applications are discussed in more detail below. Examples of polyfluorenes are described in U.S. Pat. No. 5,708,130 (Woo et al.), U.S. Pat. No. 5,900,327 (Pei et al.), and U.S. Pat. No. 6,169,163 (Woo et al.), the entire contents of which are incorporated herein by reference. The chemical structure of the polyfluorene may be modified (e.g. to include unpaired electron containing moieties) so as to reduce the spin lattice time, or to provide low frequency molecular vibrations.

Other electro-luminescent polymers, their derivatives, and mixtures may be used. Examples include polyphenylenevinylene (PPV). Electrodes 12 and 16 are chosen so as to allow charge carriers to be injected through the emissive layer. In the case of PPV, indium tin oxide and calcium may be used. Other electrode materials with appropriate work functions may be chosen. The impurity is preferably dispersed throughout the emissive film. However, the impurity concentration can have a spatial profile, for example increasing near interfaces where recombination occurs. Electron correlation effects in conjugated polymers may be controlled, for example through substituents such as side-chains, so as to increase the singlet-triplet cross-section ratio.

Additional layers may be incorporated into the general device structure of FIG. 1, as is known in the art. Anode and cathode materials may be conventionally coated with electron transporting and hole transporting organic materials. Recombination of injected carriers often occurs near the interface(s) of the emissive layer. Improved results, including device lifetime, can be achieved by moving the recombination area away from a metal-organic interface to an organic-organic interface. Hence, a hole transport layer may be added close to the anode, and an electron transport layer added close to the cathode. Devices may also contain multiple emissive films, such as for multicolor or white emitting devices, such as in SOLEDs (stacked organic LEDs). One or more emissive layer of a SOLED may be modified so as to increase the spin flip rate.

In other embodiments, the light emissive layer of FIG. 3 may be a molecular complex, molecular crystal, fullerene film, or other materials in which light emission occurs using a singlet channel. LEDs and lasers can be formed upon charge injection using a FET configuration. Multi-color devices are described in U.S. Pat. No. 6,133,692 to Xu et al., incorporated herein by reference in its entirety.

Figure 4:
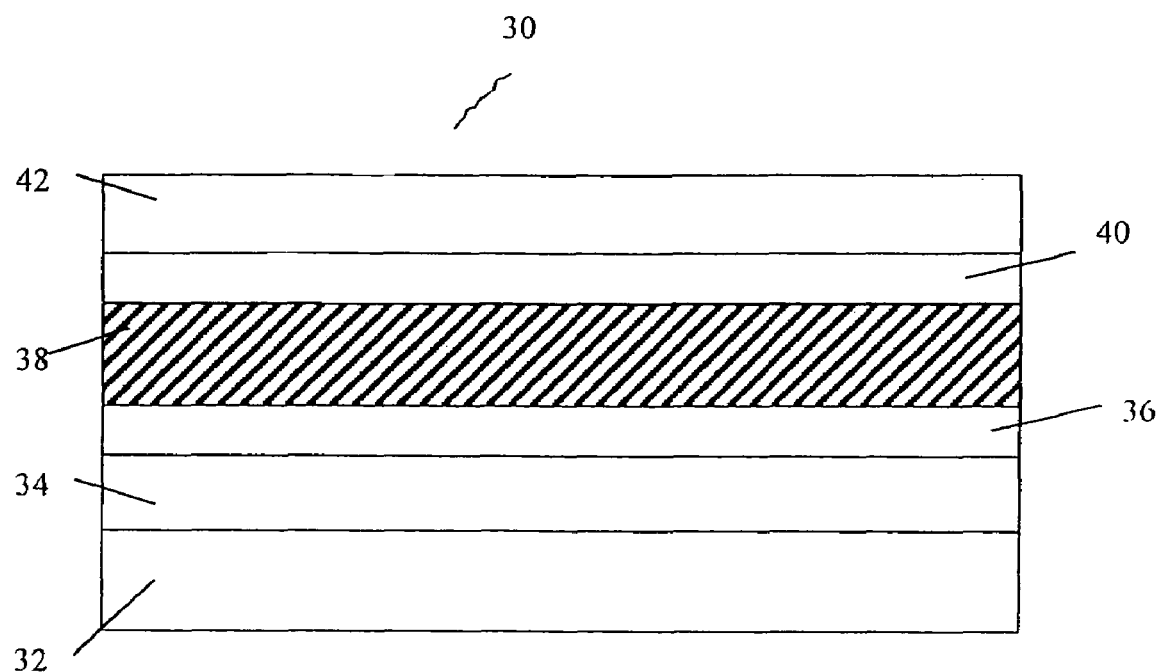
FIG. 4 is a simplified cross-section of a laser structure.

Laser structures using organic emissive layers are described in U.S. Pat. No. 6,160,828 to Kozlov et al., which is also incorporated herein by reference in its entirety. FIG. 4 shows a structure corresponding to FIG. 5 of the '828 patent. The laser structure, shown generally at 30, comprises substrate 32, a first mirror layer 34, a first electrode 36, a light emissive layer 38, a second electrode 40, and a second mirror layer 42. The emissive layer 38 comprises small organic molecules (non-polymeric molecules). In an improved laser according to the present invention, the emissive layer 38 is doped with an impurity so as to increase the spin lattice relaxation rate. Preferably, this is a paramagnetic impurity.

In other embodiments, magnetic fields, ferromagnetic impurities or other substances capable of increasing the spin flip rate are provided. In further embodiments, a magnetic field is provided so as to increase the carrier spin flip rate. The emissive layer 38 may also be a polymer layer doped with paramagnetic impurities, or otherwise modified so as to have an increased spin flip (spin relaxation) rate.

Light-emitting devices are known in which an electrically pumped light source excites a photo luminescent or phosphor layer. For example, an electrically pumped blue (or UV) light emitting diode or laser may excite a phosphor or photo luminescent film, for example to generate polychromatic (perhaps white) light. The efficiency of the overall device is increased by increasing the efficiency of the electrically pumped light emitting device using the inventive concepts of the present application. U.S. Pat. No. 5,959,316 to Lowery, incorporated herein by reference in its entirety, describes a lamp in which an electrically-pumped light emitting diode, having blue emission, illuminates a fluorescent film which provides white light.

Figure 5:
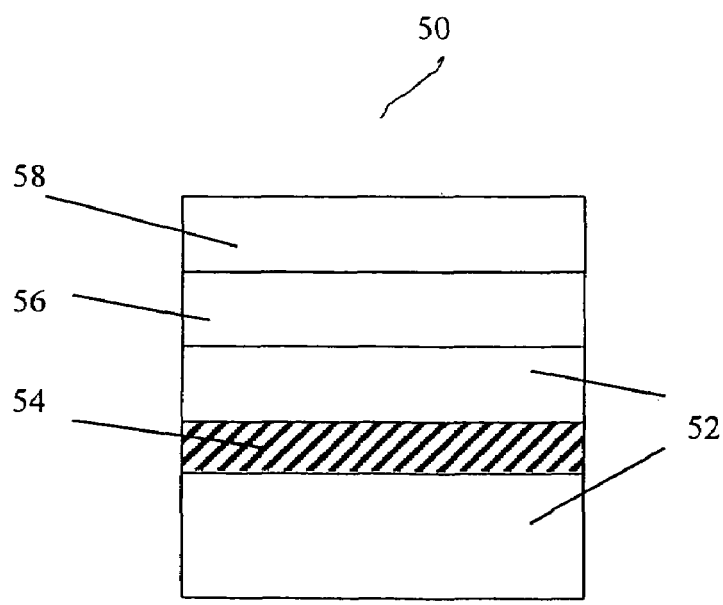
FIG. 5 is a drawing that shows an electrically pumped device illuminating a luminescent film.

The efficiency improvements of the present invention can be applied to an improved lamp in which the electro-luminescent device uses an organic emissive layer. FIG. 5 illustrates the improved lamp, shown generally at 50, having an electrically pumped electro-luminescent device 52 producing blue (or UV) radiation from organic emissive layer 54. The blue radiation passes through transparent film 56 and illuminates a photo luminescent, fluorescent or phosphorescent film 58. Film 58 produces substantially white radiation. In the improved device, layer 54 is doped with a paramagnetic substance, or otherwise modified so as to improve the spin flip rate and hence the efficiency. If the luminescent process of layer 58 includes the splitting of photo-generated excitons into separate carriers, with the later formation of new excitons which can then decay via a light emitting singlet channel, the layer 58 is also preferentially modified according to the present invention. Electrical connections to film 54 are part of structure 52.

A light modulator device can be made having an emissive layer containing molecules or molecular moieties which are paramagnetic in an excited state (they are not paramagnetic in the ground state). Such molecules are known in the art, for example as described by Epstein and co-workers in Physical Review Letters (Aug. 28, 2000), Volume 85, Issue 9, pp. 1994-1997, incorporated herein by reference in its entirety. The magnetic state is only created in these molecules upon light absorption. Such molecules would only increase the EL in the LEDs only upon light illumination. A light modulator can hence be made. Light is shone onto the active LED under operation conditions and thereby increases the electro-luminescence intensity coming out of it. Such devices may be used for optical modulation, optical communication applications, optical logic gates, optical transistors, and optical computing devices.

Figure 6:
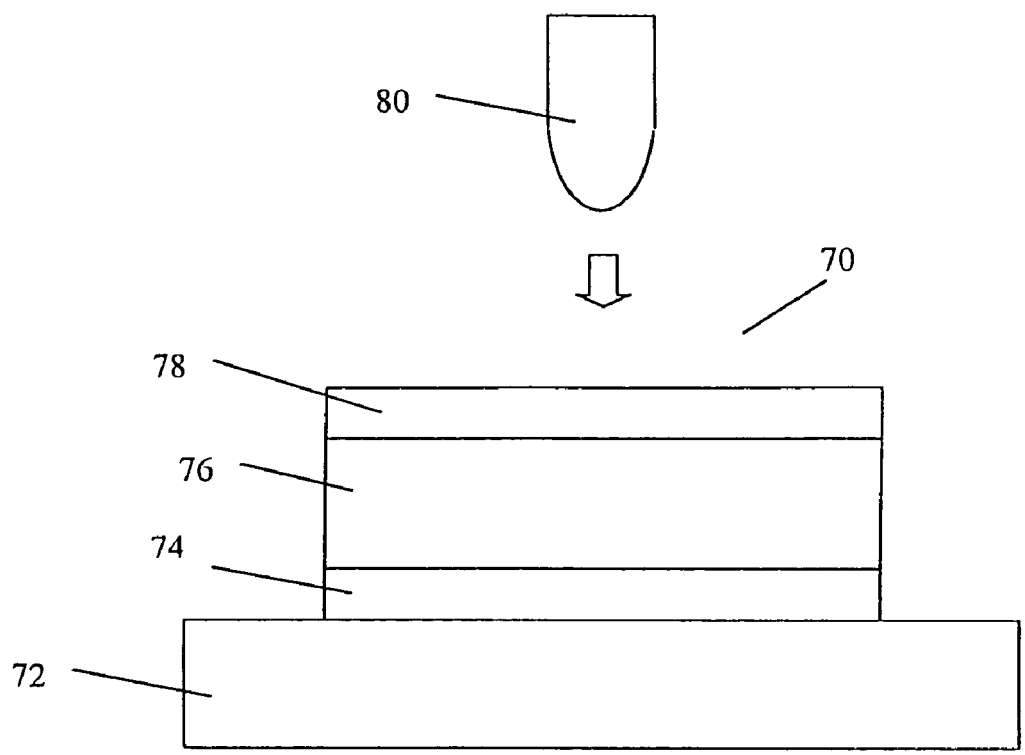
FIG. 6 is a simplified cross-section of a light-modulator structure.

FIG. 6 shows an electro-luminescent device generally at 70 having a substrate 72, first electrode 72, organic emissive layer 76, and second electrode 78. An external light source 80 (such as another LED) illuminates the device at a wavelength capable of exciting the light-sensitive paramagnetic molecules to their excited, paramagnetic state. Hence, when the LED 80 is on, the emission from the LED 70 increases. This effect can be used in optical modulation, optical communication, and optical computing schemes. The exciting source 80 may also be an integral part of the structure 70, for example as an emissive layer below or otherwise in proximity to layer 76.

Figure 7:
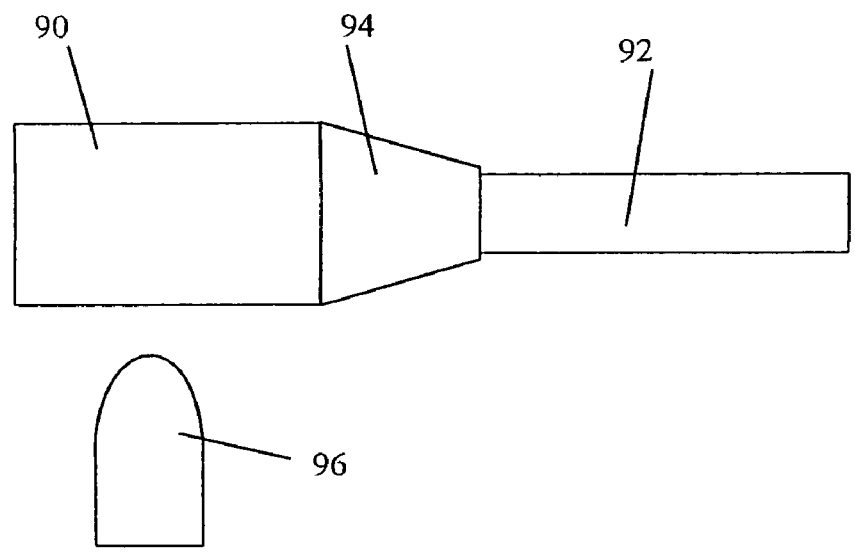
FIG. 7 is a simplified cross-section of a laser modulator structure.

FIG. 7 shows a laser 90 coupled to a fiber 92 by optical coupler 94. The laser has an emissive layer doped with a paramagnetic impurity. An external light source 96 is used to modulate the laser intensity entering the fiber by illuminating the emissive layer of the laser.

Although reference is made herein to "light emission," this should not be taken as limited to the visible region of the spectrum, insofar as the present invention equally applies to IR, UV, and other electromagnetic radiation generation by analogous processes. The methods of improving device efficiency may also be combined with other device improvements. The described examples are not intended to limit the invention, as other embodiments will be clear to those skilled in the art.

We claim:

1. A light-emitting device, comprising:
   a luminescent material having current carriers with a spin flip rate, an emissive singlet recombination channel, and a non-emissive triplet recombination channel, and wherein the singlet recombination cross section is greater than the triplet recombination cross section; and
   a magnetically active ion, radical, or molecule dopant added to the luminescent material to increase the spin flip rate of the current carriers, wherein the dopant is in the form of a microparticle, microrod, nanoparticle, metal complex of a transition metal, a doped glass, or a ceramic.

2. The light-emitting device of claim 1, wherein the material is a polymer.

3. The light-emitting device of claim 1, wherein the dopant facilitates low-frequency vibrations.

4. The light-emitting device of claim 1, comprising a polymer partially substituted with a ferrocene-containing side chain.

5. The light-emitting device of claim 1, wherein said magnetically active dopant is a metal complex of iron, manganese or cobalt.

6. A light-emitting device, comprising:
   an organic light-emitting material having carriers which exhibit a spin-lattice relaxation rate, an emissive singlet recombination channel, and a non-emissive triplet recombination channel, and wherein the singlet recombination cross-section is greater than the triplet recombination cross-section; and
   an ion, radical, or molecule dopant added to the material so as to increase the spin-lattice relaxation rate of the carriers, wherein the dopant is in the form of a microparticle, microrod, nanoparticle, metal complex of a transition metal, a doped glass, or a ceramic.

7. The light-emitting device of claim 6, wherein the material is a polymer.

8. The light-emitting device of claim 6, wherein the dopant is magnetically active.

9. The light-emitting device of claim 6, wherein the dopant facilitates low-frequency vibrations.

10. The light-emitting device of claim 6, comprising a polymer partially substituted with a ferrocene-containing side chain.

11. The light-emitting device of claim 6, wherein said dopant is a metal complex of iron, manganese or cobalt.

12. A high-efficiency light-emitting device, comprising:
    a singlet emissive electro-luminescent compound in which useful light emission occurs only through the recombination of singlet excitons and having a singlet-triplet cross-section ratio of greater than one; and
    an ion, radical, or molecule dopant, added to the compound so as to increase the spin flip rate of carriers propagating through the material, wherein the dopant is in the form of a microparticle, microrod, nanoparticle, metal complex of a transition metal, a doped glass, or a ceramic.

13. An electro-luminescent device, comprising:
    a first electrode;
    a singlet emissive electro-luminescent layer supporting the flow of current carriers having a spin-flip rate and having a singlet-triplet cross-section ratio of greater than one;
    a second electrode; and
    an organic electro-luminescent material and an ion, radical, or molecule dopant added to the electro-luminescent layer so as to increase the spin flip rate of the current carriers, wherein the dopant is in the form of a microparticle, microrod, nanoparticle, metal complex of a transition metal, a doped glass, or a ceramic.

* * * * *